United States Patent [19]

Funari

[11] 4,171,477
[45] Oct. 16, 1979

[54] MICRO-SURFACE WELDING

[75] Inventor: Joseph Funari, Vestal, N.Y.

[73] Assignee: International Business Machines Corporation, Armonk, N.Y.

[21] Appl. No.: 751,919

[22] Filed: Dec. 17, 1976

Related U.S. Application Data

[63] Continuation-in-part of Ser. No. 667,811, Mar. 16, 1976, abandoned.

[51] Int. Cl.² .................................. B23K 11/00
[52] U.S. Cl. .................... 219/56.21; 219/91.2; 219/113; 219/119
[58] Field of Search .............. 219/56, 58, 68, 85 D, 219/85 F, 91, 103, 107, 118, 119, 113, 91.1, 91.2, 56.21; 228/4.5, 179

[56] References Cited

U.S. PATENT DOCUMENTS

| | | | |
|---|---|---|---|
| 2,160,659 | 5/1939 | Hensel | 219/119 |
| 3,263,057 | 7/1966 | Conti | 219/85 F X |
| 3,263,059 | 7/1966 | Rzant | 219/119 X |
| 3,297,855 | 1/1967 | Bowers | 219/85 F |
| 3,320,401 | 5/1967 | Zachry et al. | 219/119 |
| 3,342,972 | 9/1967 | Penberg | 219/91.1 |
| 3,435,184 | 3/1969 | Schroeppel et al. | 219/119 |

OTHER PUBLICATIONS

Charles D. Hodgman, M. S., ed. "Handbook of Chemistry and Physics", 28th edition, 1944, pp. 1880–1882.
"Stored Energy Welding (cont'd)", EDN, 12/1965.
"ABC's of Stored Energy Welding, Part II", EDN, 1/1966.

Primary Examiner—J. V. Truhe
Assistant Examiner—Clifford C. Shaw
Attorney, Agent, or Firm—Cyril A. Krenzer; Gerald R. Gugger

[57] ABSTRACT

This invention relates to a method and apparatus for wire bonding a variety of metals in the interconnection of semiconductor chips to electronic package substrate circuitries. A pair of electrically conducting bonding tip members are provided which are electrically isolated from one another and which are constructed of a material having a high resistivity. The wire is positioned beneath the tip members and a load is applied to the members to force the wire against a land on the substrate. A voltage source is provided to apply a voltage between the tip members. Activation of the voltage source results in current flow through the tips and through the wire, in series, causing heating of the tip members and of the section of wire beneath them. Diffusion bonding will initiate before a significant amount of oxidation has had time to occur.

4 Claims, 8 Drawing Figures

| T.C. △ | MSW □ | USB ○ | | | | |
|---|---|---|---|---|---|---|
| WIRE SURFACES | ALUMINUM Al | GOLD Au | COPPER Cu | GOLD PLATED COPPER | TEFLON COATED | PLATINUM IRIDIUM |
| ALUMINUM Al | □  ○ | □  ○ △ | □ | □ | | |
| COPPER Cu | □ | □  ○ △ | □ | □ | □ | |
| TITANIUM Ti | | □ | | | | |
| GOLD Au | □ | □  ○ △ | □ | □ | □ | □ |
| CHROME Cr | □ | □ | □ | □ | | |
| INDIUM ANTIMONY In Sb | | □ | | | | |
| TIN-LEAD | | □ △ | □ | □ | | □ |
| NICKEL PASTE | | □ | □ | □ | | |
| PALLADIUM Pd | | □ | | □ | | |
| TERNARY PASTE | | □ | □ | □ | | |
| SILVER PALLADIUM PASTE | | □ | □ | □ | | |
| MOLYBDENUM PASTE | | □ | | | | |

<u>MATERIALS CAPABILITY</u>

MICRO-SURFACE WELDING

This application is a continuation-in-part of common assignee's copending application, Ser. No. 667,811, filed Mar. 16, 1976, now abandoned.

BACKGROUND OF THE INVENTION

In recent years, the field of electronic packaging has progressively employed smaller circuit components. Electronic functions which ten years ago would have been served by arrays of discrete transistors, capacitors and resistors, mounted on printed circuit cards, are now provided by integrated circuit chips mounted on ceramic substrate modules. This progress in miniaturization has placed greater demands upon the circuit joining technologies involved. For example, special techniques are required for bonding very small diameter wires, such as, 0.001 inches in diameter, to the very small pads or circuit terminations on the integrated circuit chips and to the lands or circuit terminations on the module substrates, for the purpose of the interconnection of the chip and module circuitries. In addition, it has become desirable to be able to produce changes in either the chip or the module circuits, including the fabrication of circuit "cross-overs" by the bonding of short wire lengths to interconnect two pads of an integrated circuit chip or two lands of a module substrate.

From a metallurgical viewpoint, there are three types of bonding mechanisms conventionally employed in the interconnection of integrated circuit chip pads to the lands of the module substrate. They are: (a) bonding of solder fusion, (b) bonding by metallic diffusion at elevated temperature, and (c) bonding by room temperature diffusion. In electronic packaging, an example of the first mechanism (a) would be where molten solder is used to join substrate lands to the pads of integrated circuit chips which are mounted in a "flip-chip" or circuit-side down orientation. This is a very economical means for interconnecting integrated circuit chip and substrate circuitries. However, there are some instances wherein it is not convenient to use the "flip-chip" orientation. where a severe requirement for heat transfer from chip to substrate exists, back-bonding the integrated circuit chip to the substrate in a circuit-side up orientation is often necessary. Back-bonding of the integrated circuit chip to the substrate is also necessary in some applications of unusually large integrated circuit chips for which cyclic-temperature environmental conditions could cause a solder joint fatigue problem. Where back-bonding of integrated circuit chips is employed, it is necessary to bond a conducting element at its ends to each chip pad and substrate land where an interconnection is desired. The conducting element could be a wire, a circuit line on a decal, or any similar element providing the interconnection function.

Where it is necessary to bond a wire to a chip pad and to a substrate land in order to interconnect them, any of the aforementioned mechanisms (a), (b) or (c) could be employed. However, the two types of wire bonding processes conventionally used involve only the latter two mechanisms (b) and (c). The process involving mechanism (b) is called thermo compression wire bonding. In this process, illustrated in FIG. 1, a ball is first formed on the end of the wire to be bonded by melting the end with a hydrogen flame. The balled end of the wire is then forced against a metal land or pad under a predetermined load imposed by the hollow tip through which the wire passes. This tip and/or the substrate land or chip pad are heated by appropriate means and the heat passes from these elements to the wire ball bringing the ball to an elevated temperature. The load causes the hot ball to plastically upset and the plastic spreading of the ball over the land results in fragmentation of oxide films, and any other films, at the ball-land interface, in the contact between clean ball metal and clean land metal, in the codiffusion of the metals across the interface, and in the alloying of the metals causing a high strength bond at the original interface.

The conventional wire bonding process involving mechanism (c) is called ultrasonic bonding and is illustrated in FIG. 2. In this process, the end of the wire to be bonded is positioned under a bonding tip by means of a wire-guide hole in the tip. A load exerted on the tip causes the wire to be forced against the substrate land or against the chip pad. A horizontal cyclic displacement of the tip relative to the substrate is produced at an ultrasonic frequency for a predetermined length of time. This ultrasonic motion scrubs the wire-land interface surfaces, fragmenting oxide films and any other films to produce clean-metal to clean-metal contact at the interface surfaces and producing a shallow room temperature diffusion and alloying of the surface metals. This results in a metallic bond between the wire and the land or pad. It is believed that frictional heat developed by the ultrasonic motion at the interface surfaces probably results in diffusion occurring at somewhat higher than room temperature.

The two conventional categories of wire bonding methods (b) and (c) described above have exhibited several disadvantages, however, and the need to eliminate these has led to the superior micro-surface welding process which will be described later. With both of the conventional wire bonding methods (b) and (c), the practical use of metallurgies for both the wire and the land or pad is limited to gold and aluminum and some alloys of these metals. The success in ultrasonic wire bonding with gold and aluminum appears to be a consequence of some chemical or metallurgical surface characteristic. Although the reasons for this characteristic are not generally agreed upon, they appear to be due to a lack of an oxide on the surface of the gold and the high chemical and/or metallurgical reactivity of the aluminum surface, once the aluminum oxide film has been fragmented. Metals other than gold and aluminum do not appear to have such characteristics to establish good alloying and high strength bonding at the interface at the room temperature conditions of conventional ultrasonic bonding. Ultrasonic bonding also presents the problem of being sensitive to machine vibration and dirt and sensitive to operator set-up.

When an attempt is made to use conventional thermocompression bonding, with its elevated temperature, with wire metals other than gold, the high rate of oxide formation appears to offset the benefits of scrubbing and oxide fragmentation in providing clean metal contact. In addition, there is the necessity of heating the substrate and of using hydrogen to melt the balled end of the wire. There are some wire bonding equipments which combine features such as the elevated temperature and ultrasonic scrubbing of thermo-compression and ultrasonic bonding. However, this combination of features does not permit the use of wires of metals other than gold to be used for wire bonding to a practically significant degree.

Other prior art techniques for wire bonding or welding are disclosed in U.S. Pat. Nos. 2,160,659; 2,253,375; and 3,089,020. Pat. No. 2,160,659 uses highly conductive metals such as silver, copper, and other highly conductive alloys mixed with carbide for a combination of wear and a large flow of current through the tips. The tips employed have a very low resistivity and the bonding is done by the passage of heavy current through the wire to melt the wire. This type of resistance welding technique where the resistance of the wire creates the heat cannot be used with very small diameter wire because burn out or blow up of the wire will occur.

U.S. Pat. No. 2,253,375 teaches the use of welding electrodes composed of molybdenum powders and the electrodes have a relatively low resistivity in the order of 27 micro-ohm centimeters. The electrodes are energized by means of a transformer. When welding with this type of arrangement, power is continuously being pulled from the transformer which results in burning out of the wire and in order to prevent this it becomes necessary to employ some sort of cooling means.

U.S. Pat. No. 3,089,020 shows the use of a pair of electrodes connected to a capacitor discharge circuit whereby the capacitor discharge pulse is passed serially through one electrode, the wire, the component the wire is being bonded to, back through the wire, and through the other electrode to effect the bond. This welding technique is used to bond to printed circuit type metallic foil components; however, it cannot be used when interconnection bonding integrated circuit chips and lands. The passage of current through the integrated chip would blow the chip up and the lands or pads being interconnected are mounted spaced apart on a substrate of ceramic or insulator material.

SUMMARY OF THE INVENTION

The present invention makes it possible to wire bond a great variety of metals to chips and lands or pads on integrated circuit modules by providing a novel and improved welding technique wherein the temperature at the interface or bonding region is brought very close to the melting point of the wire in a very short period of time. To accomplish this, a bonding mechanism is provided which comprises two parallel electrically conducting members electrically isolated from each other by a thin layer of insulation. The wire to be bonded is positioned under the tips of these members by way of a wire-guide hole in one of the members. There is provided an appropriate electrical voltage source, such as, a capacitor charging and discharging circuit, whereby a voltage is applied between the two tip members. A load is exerted on the tip members causing the wire to be forced against a land or chip on a substrate and the heated section of the wire, which is that section under the tips, will complete an electrical circuit of the tip members and the voltage source. When the voltage source is activated to apply the tip voltage, current will flow through the tips and through the heated section of the wire, in series, causing heating of the tip members and of the heated section of the wire. In this manner, the heated section of the wire which is at the bonding interface is used as the heat source to that interface region.

In the welding technique of the present invention, the heat is immediately available for the bonding reactions, which involve plastic upset at elevated temperature and metallic diffusion, and the heat does not, as in conventional prior art bonding, have to travel from heat sources, such as the heated tip and the heated substrate, and into the wire and into the land or chip. In the present improved technique, the interface region is raised almost instantaneously to a temperature just below the melting temperature of the wire and, therefore, diffusion bonding is initiated before a significant amount of oxidation has had time to occur.

An important aspect of the present invention is the material which make up the bonding tips. The two conducting elements of the tip should be made of high resistivity material. The minimum desired resistivity is in the order of 100 micro-ohm centimeters which is obtained by using titanium carbide. The use of this high resistivity material for the tips, as well as other materials of much higher resistivity, accomplishes two things. The first is that the flow of current passing through the tips and the heated section of the wire, in series, heats the tip elements as it heats the heated section of wire and the heated tip elements do not, therefore, tend to draw off the heat generated in the heated section of wire.

The second beneficial feature of the high resistivity tip material is in its contribution to the contact resistance between the tip elements and the heated section of the wire. The heated section of the wire is heated primarily because of this contact resistance due to the power generated by the current passing through the contact resistance and not because of the bulk resistivity of the wire itself. A large voltage drop occurs at the tip interface with the wire which limits the flow of current through the wire and prevents the wire from overheating and blowing up. Also, a heat spike occurs at the interface between the tips and the wire and as a result the wire is not re-flowed into a glob but instead it is fused in a precise spot under the tip which makes for better fusion. The bonds will appear under the tips in the same shape and size as the shape and size of the tips.

It is, then, a primary object of the present invention to provide a novel and improved method and apparatus for wire bonding a variety of metals in the interconnection of semiconductor chips to electronic package substrate citrcuitries.

A further object of the present invention is to provide a novel and improved method and apparatus for wire bonding wherein the interface bonding region is brought to a temperature very close to the melting temperature of the wire in a very short period of time.

Another object of the present invention is to provide a novel and improved wire bonding apparatus comprising bonding tips constructed of high resistivity material to provide substantial contact resistance between the tips and wire.

A still further object of the present invention is to provide a novel and improved apparatus for bonding wire to a substrate which comprises electrically isolated bonding tips of high resistivity material and circuit means for passing current through the tips and wire in series.

The foregoing and other objects, features and advantages of the invention will be apparent from the following more particular description of a preferred embodiment of the invention as illustrated in the accompanying drawings.

BRIEF DESCRIPTION OF THE DRAWINGS

FIG. 3b is a schematic illustration looking at the welding tip end of the apparatus of FIG. 3a.

DESCRIPTION OF PREFERRED EMBODIMENT

Figure 1:
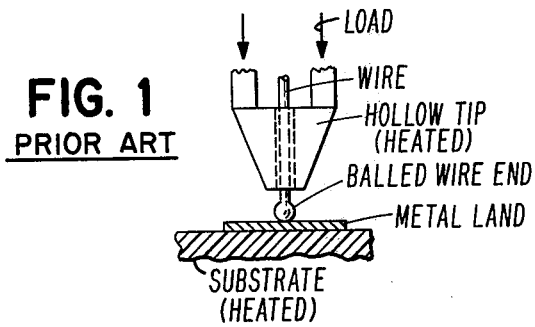
FIG. 1 is a schematic illustration of the prior art thermo-compression wire bonding mechanism.
Figure 2:
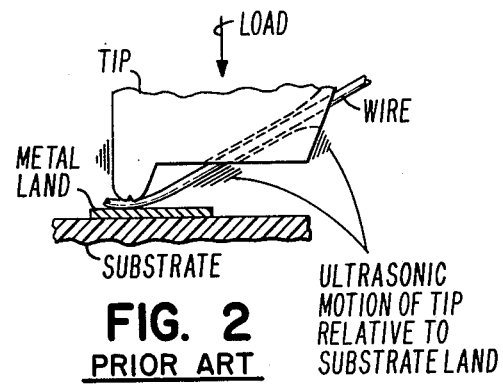
FIG. 2 is a schematic illustration of the prior art ultrasonic wire bonding mechanism.
Figure 3B:
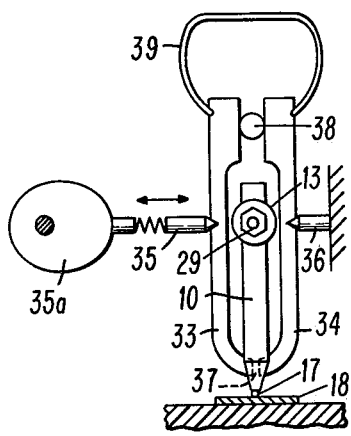
Figure 3C:
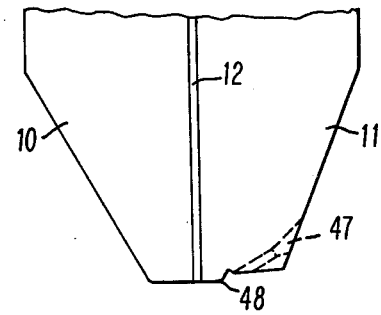
FIG. 3c is an enlarged view showing the bottom or end configuration of the welding tips.
Figure 3A:
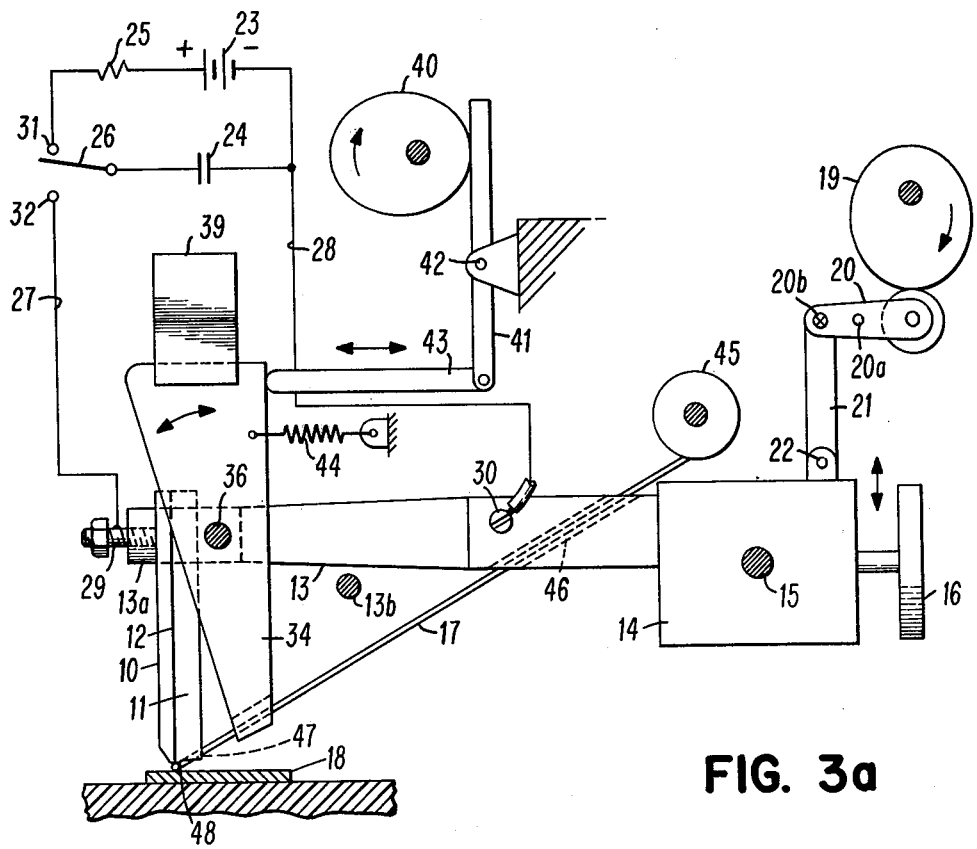
FIG. 3a is a schematic illustration of the microwelding apparatus of the present invention.

Referring to FIGS. 3a, 3b and 3c there is shown the micro-surface welding apparatus of the present invention. The apparatus comprises a pair of juxtaposed electrically conducting bonding tip members 10 and 11 which are electrically isolated from each other by a thin sheet of insulation material 12, such as, mica, glass, or the like. As more clearly shown in FIG. 3c, the bottom of tip 11 is stepped to leave the bottom surface of the tips with approximately the same area as the wire section being bonded. Also, it provides wire clearance for a wire guide hole or groove and also a sharp edge for breaking the wire after bonding. As will be further described, the bonding tip members 10 and 11 are constructed of a of a material having a high resistivity. The bonding tip assembly is fixed to a support arm 13 attached to an end block member 14 which is pivotally mounted on a support shaft 15. Attached to the end of block 14 is a counter-balancing weight member 16.

To lower and raise the bonding tip assembly into and out of contact with a wire 17 positioned between the ends of the tips and a metallized circuit land 18, or the like, on a substrate to which the wire is to be bonded, there is provided a motor driven eccentric cam 19 which operates against a cam follower arm 20. The cam follower arm pivots about a pivot rod 20a, attached to a frame, and it is pivotally attached at 20b to one end of a link arm 21 and the other end of the link arm is pivotally mounted at 22 to the block 14. When the cam follower coacts with the low portion of the cam, support arm 13 will be pivoted clockwise about shaft 15 to raise the bonding tip assembly out of contact with the wire. when the cam follower coacts with the high portion of the cam, support arm 13 will be allowed to pivot counterclockwise by virtue of its weight and the bonding tip assembly will drop into contact with the wire. The counter-balancing weight member 16, which may be made adjustable, is provided to control the contact pressure exerted on the wire by the bonding tips.

The source of electricalpower for the bonding tips is preferably a capacitor charging-discharging circuit. As shown in FIG. 3a, the circuit comprises a DC potential source or battery 23, a capacitor 24, a capacitor charging resistor 25, and a single pole-double throw switch 26. The circuit is connected to the bonding tips by way of conductor leads 27 and 28. Lead 27 is connected to a metallic screw 29 mounted in the front tip portion 13a of support arm 13. The screw 29 makes electrical contact with the bonding tip 10 and the support arm front tip portion 13a which extends to the bonding tip 10 is constructed of a non-conducting plastic material. Lead 28 is connected to a metallic screw 30 which is fastened to the main portion of support arm 13 which extends rearwardly from the bonding tip 11. This portion of the support arm is constructed of a conducting metal and it makes electrical contact with the bonding tip 11. When switch 26 is connected to its terminal 31, capacitor 24 will become charged and when the switch is connected to its terminal 32, capacitor 24 will discharge and current will flow through bonding tip 10, wire 17, and bonding tip 11 in series to effect bonding of the wire when the tips are down in bonding position in contact with the wire, as shown in FIG. 3a.

There is provided a wire clamping, feeding and cutting mechanism. Referring to both FIGS. 3a and 3b, the mechanism comprises a pair of clamp members 33 and 34 arranged one on each side of the support arm 13 and in proximity to the bonding tips 10 and 11. The clamp member 33 is mounted on a spring biased pivot member 35 which is movable horizontally by a suitable cam mechanism 35a. Clamp member 34 is mounted on a fixed pivot member 36. The bottom ends of the clamp members are curved toward each other to provide a gap 37 which receives the wire 17. The inner surfaces of the upper ends of the clamp members are biased against a pivot rod 38 by means of a U-shaped spring 39 the ends of which press against the outer surfaces of the upper ends of the clamp members so that normally the gap 37 is maintained sufficiently open so as to not grip or clamp the wire therein. To grip or clamp the wire to feed same, the pivot member 35 is moved against clamp member 33 to reduce the gap 37 whereby the ends of the clamp members will grip the wire.

Referring to FIG. 3a, the wire clamping and feeding mechanism is pivoted clockwise and counter-clockwise by means of an eccentric cam 40 which coacts with a follower arm 41 pivotally mounted at 42. Connected to the end of the follower arm is a slideable pusher arm 43 which bears against the clamp member assembly and connected to the assembly is a biasing spring 44.

Briefly, in the sequence of operation of the various mechanisms, at the start of a cycle the clamp members 33 and 34 are in a closed or clamping position and the support arm 13 is in a horizontal position. The operator threads the wire 17 from a supply spool 45, through a suitable guide hole 46 in the support arm 13, in between the clamp members 33 and 34, by manually opening them, then through a wire guide groove 47 in the bonding tip 11, and into a position beneath the bonding tips 10 and 11. The clamp members 33 and 34 are now manually released so that they will close to the clamping position and cam 19 is operated to tilt the support arm 13 counter-clockwise from a horizontal position by approximately 4 degrees.

The 4 degree tilt movement brings the bonding tips down to a search height position which is approximately 0.002 inches above the wire and substrate at which point further dropping of the support arm 13 and the bonding tips is stopped by means of a cam operated adjustable screw arm mechanism, not shown, which is independent of cam 19 and which actuates an arm or rod 13b vertically up and down. Rod 13b extends underneath the support arm 13 and is actuated to its up position to stop the arm at the 0.002 inch search height above the wire. At this time, cam 19 is also stopped momentarily by means of a suitable timing disc which controls a DC motor which drives the cam. The 0.002 inch search height position can be varied, if desired, by adjusting the adjustable screw arm. At this point, the operator moves the substrate to further position the end of the wire onto the precise spot on the substrate at which it is to be bonded.

Next the adjustable screw arm mechanism is released to move the rod 13b down to its bottom position and cam 19 is operated to cam the support arm 13 and bonding tips down to the weld position. The drop of arm 13 is short to prevent undue impact and the arm and bonding tips set on the wire as a dead load free from cam 19. The dead load is preset by the counterbalance weight 16. The circuit is now activated to discharge the capacitor 24 and pass current through the bonding tips and wire in series to effect the bond, the clamp members are then opened, and the bonding tips are returned upward to an adjustable loop height position or a full horizontal position to clear the substrate and wire. This loop height is adjustable and might not necessarily be fully horizontal depending on the substrate metallurgy and components.

With one end of the wire now bonded, the operator moves the substrate to the next bonding position. The wire moves freely in its threaded path as it is pulled by the substrate. The bonding tips are again moved down to 0.002 inches and the operator places the substrate in the desired precise position. The clamp members now close by camming pivot member 35 and the bonding tips are moved down into contact with the wire, and the circuit discharged to bond the other end of the wire. While the tips are still in contact with the wire and the clamp members are closed, cam 40 operates to move the clamp members counter-clockwise or rearwardly and the wire is broken by the sharp bottom edge 48 of the bonding tip 11. When the wire is being broken by the counter-clockwise movement of the closed clamps, the section of wire between the bonded end and the clamps is stretched and this makes it possible to feed the required amount of wire back under the tips on the next bonding cycle. The bonding tips are now returned upward and the closed clamp members are pivoted clockwise to feed wire into position beneath the tips in preparation for another bonding cycle.

If necessary, the cam mechanism 40 may be made so that the clamps pivot a greater distance clockwise against a stop than they move counter-clockwise to insure that the required amount of wire is fed under the tips for the next bonding cycle. Also, where wire larger than 0.002 inches is to be bonded it may be necessary to employ a knife mechanism to nick or partially sever the wire prior to the wire being broken.

Although most of the above described mechanisms are known and available in commercial equipment, with the exception of the bonding tips of substantially high resistivity material, they have been briefly shown and described to illustrate one type of wire bonding equipment to which the principles of the present invention may be applied.

As was previously mentioned, the important aspect of the present invention resides in the fact that the bonding tips 10 and 11 are constructed of a material having a substantially high resistivity compared to the resistivity of the wire being bonded. It was found that the minimum resistivity which will give the desired fusion results is in the range of 100–170 micro-ohm centimeters which is the resistivity range of titanium carbide. In comparison, the resistivity of gold wire used for bonding is approximately 2.35 micro-ohm centimeters. In addition to titanium carbide, excellent results were obtained by constructing the tips from carbon and its alloys which have a resistivity in the range of 4000–5000 micro-ohm centimeters. Other materials which it is anticipated will not only give good results but additionally will increase the life of the tips are a combination of carbide and graphite having a resistivity of 3200 micro-ohm centimeters and up, silicon carbide having a resistivity of 200,000 micro-ohm centimeters and up, a zirconium boride silicon carbide composition having a resistivity range of 170–200 micro-ohm centimeters, and silicon crystals having a resistivity range of 4000–5000 micro-ohm centimeters.

Figures 4, 5:
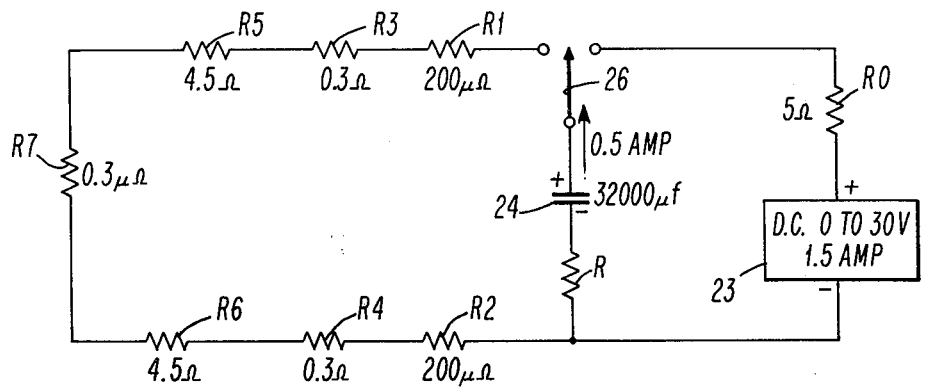
FIG. 4 is a diagram showing the equivalent electrical circuit of the apparatus shown in FIGS. 3a and 3b.
FIG. 5 is a chart showing a comparison of the wire and substrate materials bonded by the present microwelding apparatus and the prior art thermo-compression and ultrasonic bonding apparatus.

Referring now to FIG. 4, there is shown an equivalent electrical circuit for the apparatus shown in FIGS. 3a and 3b. The circuit values shown are for a welding cycle that was made to bond 0.001 inch gold wire to a gold surface or land using titanium carbide bonding tips. Power of 4.5 volts was used to deliver a current spike of 0.5 amps for 250 milli-seconds. Heat generated at the interface of the bonding tips and the gold wire was approximately 800° C. RO represents a 5 ohm load on the DC power supply 23. Capacitor 24 had a value of 32,000 micro-farads. R1 and R2 are the resistances of the wire leads from the power source 23 to the titanium carbide bonding tips and they were equal at 200 micro-ohms each. R3 and R4 represent the material resistivity of the titanium carbide bonding tips which for each tip was 0.3 ohms. R5 and R6 represent the contact resistance between the bonding tips and the gold wire and these were each 4.5 ohms. R7 represents the resistance of the length of gold wire from bonding tip to bonding tip that was welded and this was 0.03 micro-ohms. It was found that in order to effect the desired contact resistance at the interface of the bonding tips and the wire being bonded, the resistance ratio between the wire material and the bonding tip material, R7/(R3 or R4), should be a minimum of 1 to 11.

To illustrate two other examples of the many materials which were successfully fused or bonded using the present micro-surface welding technique, 0.0015 inch copper wire was bonded to a chrome surface land using titanium carbide bonding tips powered at 14 volts for 200 milli-seconds. A minimum temperature of 750° C. was generated at the interface of the bonding tips and wire. Also, 0.003 inch copper wire which was tin-lead coated was bonded to a tin-lead coated land using titanium carbide bonding tips powered at 10 volts for 200 milli-seconds. A minimum temperature of 400° C. was generated at the interface of the bonding tips and the wire.

Referring to the chart shown in FIG. 5, there is depicted a comparison of the materials bonding capability of thermal compression bonding TC, represented by a triangle; ultrasonic bonding USB, represented by a circle; and the present micro-surface welding technique MSW, represented by a square. All of the various material combinations shown between the surface material and the wire material that was bonded thereto were carried out and, as shown, it was found that many more material combinations were successfully bonded using the micro-surface bonding technique than was possible using the described prior art techniques. As was previously pointed out, the improved success of the present microsurface bonding technique is attributed to the use of bonding tips which are constructed of a material having a substantially high resistivity which results in a large voltage drop at the interface with the wire being bonded which limits the flow of current through the wire and the temperature at the interface is raised almost instantaneously to effect diffusion bonding before a significant amount of oxidation has had time to occur. Wire having a diameter of 0.0005 inches to 0.005 inches can be bonded to pad or land sizes of 0.002 inches by 0.002 inches, and up, and having a thickness of 500 angstroms, and up. Either evaporated conductor or paste conductor circuits on metallized ceramic substrates may be bonded to.

Figure 6:
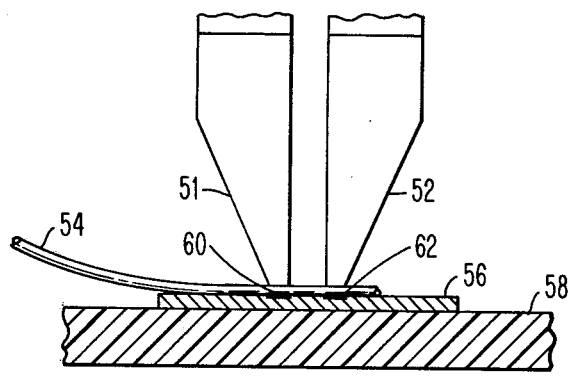
FIG. 6 is a partial enlarged view showing the relationship between the bonding tips and the bond sites according to the present invention.

The characteristics of the bonds thus made are illustrated in the enlarged view of FIG. 6. The bonding tips 51, 52 contact the wire 54 and after current has passed directly and serially through the tips and wire, the heat generated at the contact points therebetween passes rapidly through the wire to the bond pad 56 on the substrate 58. Accordingly, the actual bonds 60, 62 closely approximate the size and shape of the tips 51, 52 and are located therebeneath. If only one of the bonding tips is constructed of a high resistivity material, then only one bond would be made.

In addition to accommodating a greater number of wire material-land material combinations because of its high heating rate and low oxidation development at the bonding interface, the present micro-surface welding technique may be conveniently used to bond insulated wire. Under practical land levels, the tip elements can penetrate some types of wire insulation coatings; such as, Teflon, a product of E. I. du Pont de Nemours & Company, extruded polyamide, polyurethane, and varnish, sufficiently to contact the wire and effect the bonding operation. Since the bonding cycle is so short, only the insulation in the heated section is burned away or damaged. It was also observed that the high power-density and short cycle conditions permit bonding without the necessity to heat the substrate. This gives protection from heating effects of any heat sensitive materials or devices on the substrate.

Other advantages of the present bonding technique is that it is very insensitive to floor vibration of the bonding equipment, to the degree of squareness of the bonding surface to the bonding tip axis, to the cleanliness of the bonding land or pad, and to the hardness of the land or pad. Unlike ultrasonic bonding equipment, it is not necessary to tune to a frequency or a power input in order to produce good wire bonds.

Some substrate heating may be used effectively to enhance bonding results particularly if the bonding land is wide or thick and is able to act as a powerful heat sink.

As was described, the preferred source of electrical power is a charged capacitor which is discharged, by the use of an appropriate switch, through the bonding tip circuit. This arrangement provides high "time-zero" current and power conditions for rapidly heating the section of wire under the bonding tips. However, it is not intended to exclude the use of any other appropriate type of power source which will produce the desired results.

While the invention has been particularly shown and described with reference to a preferred embodiment thereof, it will be understood by those skilled in the art that various changes in form and details may be made therein without departing from the spirit and scope of the invention.

What is claimed is:

1. The method of micro-surface bonding a metal lead not exceeding 0.005 inches in diameter to metallized circuitry on a substrate comprising the steps of:
   positioning said lead over a portion of said metallized circuitry to which the lead is to be bonded;
   actuating a pair of electrically conducting tip members to maintain said lead in interface contact with the tips of the bonding members and said portion of the metallized circuitry; and
   passing a single current pulse of up to 0.5 amps for up to 250 milliseconds directly and serially through said bonding tip members and lead, the resistance ratio between the material of said lead and the material of said bonding tip members being at least 1 to 11 whereby the contact resistance at said interface between said lead and said bonding tip members results in the rapid generation of heat thereat to effect diffusion bonding of said lead before a significant amount of oxidation has had time to occur, whereby the bond of said lead will take place substantially only under said bonding tip members in approximately the same shape and size as the shape and size of said bonding tips.

2. The invention according to claim 1 wherein said lead is a gold wire of approximately 0.001 inch in diameter and said metallized circuitry is gold.

3. The invention according to claim 1 wherein the passing of a single current pulse directly and serially through said bonding tip members and lead comprises discharging a charged capacitor to directly pass a single current pulse directly and serially through said bonding tip members and lead.

4. The invention according to claim 1 wherein said bonding tip members are constructed from titanium carbide and said lead and metallized circuitry are constructed from gold.

* * * * *